United States Patent
Degani et al.

(10) Patent No.: US 8,773,182 B1
(45) Date of Patent: Jul. 8, 2014

(54) STOCHASTIC BEATING TIME-TO-DIGITAL CONVERTER (TDC)

(71) Applicants: Ofir Degani, Haifa (IL); Ashoke Ravi, Hillsboro, OR (US); Hasnain Lakdawala, Portland, OR (US); Rotem Banin, Pardes-Hana (IL)

(72) Inventors: Ofir Degani, Haifa (IL); Ashoke Ravi, Hillsboro, OR (US); Hasnain Lakdawala, Portland, OR (US); Rotem Banin, Pardes-Hana (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/756,670

(22) Filed: Feb. 1, 2013

(51) Int. Cl.
*H03L 7/06* (2006.01)

(52) U.S. Cl.
CPC .............. *H03L 7/06* (2013.01); *H03L 2207/50* (2013.01)
USPC ........... 327/156; 327/147; 327/158; 327/161; 375/371; 375/373; 375/376; 331/45; 331/50; 331/55; 331/57

(58) Field of Classification Search
CPC .................................................. H03L 2207/50
USPC .................... 327/156, 158; 375/371, 374, 375
See application file for complete search history.

(56) References Cited

U.S. PATENT DOCUMENTS 8,390,349 B1 * 3/2013 Ravi et al. ..................... 327/156

* cited by examiner

*Primary Examiner* — John Poos
(74) *Attorney, Agent, or Firm* — Thorpe North & Western, LLP (57) ABSTRACT

A stochastic beating time-to-digital converter (TDC) can include triggered ring oscillator (TRO) and a stochastic TDC (sTDC). The TRO, when triggered by a reference signal edge, can generate a periodic TRO signal with a TRO period that is a selected ratio of a voltage-controlled oscillator (VCO) period. The TRO period can be greater than or less than the VCO period by the specified ratio. The sTDC with an event triggered memory can include an sTDC component with a plurality of groups of latches. Each group of latches can be configured to sample and store a VCO state at an edge of a TRO signal. The sTDC component can trigger a capture of a select number of VCO states of the group of latches when one latch in the group of latches transitions to a different digital state referred to as a transition edge.

26 Claims, 9 Drawing Sheets

STOCHASTIC BEATING TIME-TO-DIGITAL CONVERTER (TDC)

BACKGROUND

Many electronic devices operate off a periodic clock signal to synchronize the transmission of data between electronic components within the device. Periodic clock signals can be provided by an oscillator, such as voltage controlled oscillator (VCO) or digitally controlled oscillator (DCO). Periodic clock signals are also used in radio devices and wireless devices to generate specified frequencies that can be used for a variety of purposes including upconversion, downconversion, and transmission on a carrier frequency. A wireless communication device may be allocated a specified range of frequency bands in which data is transmitted. A VCO/DCO can be used in a phase-locked loop (PLL) to generate various frequency bands. A time-to-digital converter (TDC) can be used to measure the VCO/DCO instantaneous phase with respect to a clean reference clock in a phase-locked loop (PLL) in order to lock the frequency of the VCO/DCO to specified frequency.

A wireless communication device (e.g., user equipment (UE)) for emerging gigabit per second wireless standards can require local oscillator (LO) signals with very good spectral purity. Digital fractional-n PLLs can be an attractive choice for LO generation in high performance radio transceivers on account of the small area, ease of porting, PVT (process, voltage and temperature) insensitive loop dynamics and scan programmability/re-configurability. The resolution and linearity of the time-digital converter (TDC) can limit the spectral purity achievable with a digital fractional-n PLL. As an example, a fractional-n PLL for the 5 GHz band can require the TDC to span a dynamic range of two hundred picoseconds (ps). At the same time, the TDC resolution and non-linearity can be required to be better than 1 ps in order to meet a phase noise and spur requirements of devices using gigabits per second (Gbps) wireless standards. Gbps wireless standards can include the third generation partnership project (3GPP) long term evolution (LTE), the Institute of Electrical and Electronics Engineers (IEEE) 802.16 standard (e.g., 802.16e, 802.16m), which is commonly known to industry groups as WiMAX (Worldwide interoperability for Microwave Access), and the IEEE 802.11 standard (e.g., 802.11ac, 802.11ad), which is commonly known to industry groups as WiFi.

A conventional digital PLL achieves a several pico-second TDC resolution through the use of techniques such as delay Verniers or delay interpolation. Mismatch and variations along the TDC delay line can introduce non-linearity and non-monotonicity in the TDC behavior, further degrading the PLL performance. The TDC delay cells can be sized up to reduce mismatch and variations. Consequently, the power dissipation can increase quadratically with resolution, rendering the design impractical for higher resolution TDCs with sub-picosecond resolution.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

EXAMPLE EMBODIMENTS

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

The gigabits per second (Gbps) wireless standards (e.g., IEEE 802.11ac, IEEE 802.11ad, and 5G cellular (LTE Release 11)) can require higher error vector magnitude (EVM) and very good spectral purity to handle the higher data-rates, which can impose strict demands on the local oscillator (LO), such as an integrated phase noise (iPN) of less than −45 dBc and spurs of less than −60 dBc. Error vector magnitude (EVM), sometimes also called receive constellation error (RCE), can be a measure used to quantify a performance of a digital radio transmitter and/or receiver. Decibels relative to the carrier (dBc) is the power ratio of a signal to a carrier signal, expressed in decibels. The decibel (dB) is a logarithmic unit that indicates the ratio of a physical quantity (usually power or intensity) relative to a specified or implied reference level. A ratio in decibels is ten times the logarithm to base 10 of the ratio of two power quantities.

Phase noise is the frequency domain representation of rapid, short-term, random fluctuations in the phase of a waveform, caused by time domain instabilities (e.g., "jitter"). The phase noise can be used to characterize an oscillator. Phase noise can be measured and expressed as a power obtained by integrating a phase noise L(f) over a certain range of offset frequencies. For example, the phase noise may be −45 dBc integrated over the range of 1 gigahertz (GHz) to 6 GHz, referred to as an integrated phase noise. A spurious tone (also known as an interfering tone, a continuous tone, or a spur) denotes a tone in an electronic circuit which can interfere with a signal and the spur can often be masked underneath that signal. Spurs can be any tones other than a fundamental tone or the fundamental tone's harmonics.

Fractional-N (fracN) digital phase lock loops (DPLLs) can be beneficial for LO generation due to their reduced area, lower power requirements, and their ease of porting and scalability between process generations compared to an analog fracN PLLs. Other advantages or fracN DPLLs can include process, voltage and temperature (PVT) insensitive loop dynamic and programmability/re-configurability of loop performance.

Figure 1:
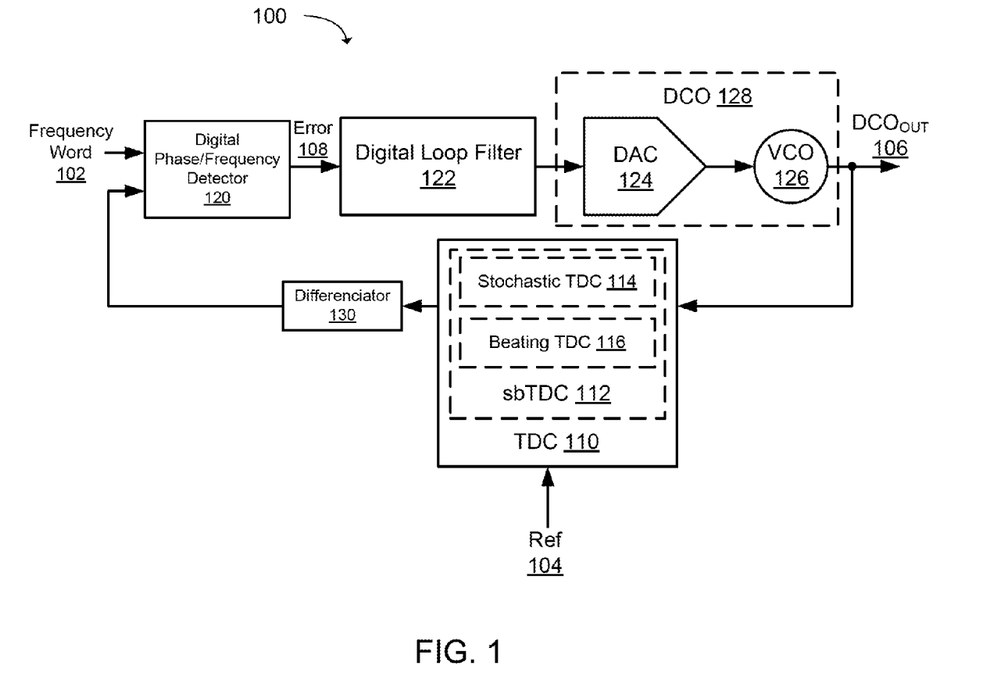
FIG. 1 illustrates a diagram of an all-digital phase locked loop (ADPLL) in accordance with an example.

An all-digital phase locked loops (ADPLLs) 100 architecture can be suitable for fractional-n operation, which can include a TDC 110, as illustrated in FIG. 1. The TDC may include a stochastic beating time-to-digital converter (sbTDC) 112, which is described in greater detail below. The sbTDC can include a stochastic TDC 114 and a beating TDC 116. Typically, in order to achieve the sub-pico-second-delay resolution used in many wireless standards, the TDC may be implemented as a delay Vernier. The Vernier TDC can be analogous to a flash analog-to-digital converter (ADC) but operating in the time domain.

For an all-digital phase locked loops (ADPLLs), a time-to-digital converter (TDC) can be used for converting phase information of a voltage-controlled oscillator (VCO) into a digital domain. The ADPLL 100 can include a digital phase/frequency detector 120, a digital loop filter 122, a digitally controlled oscillator (DCO) 128, a TDC 110, and a differentiator (or differenciator) 130, as illustrated in FIG. 1. The digital phase/frequency detector can integrate frequency error 108 by comparing a frequency word input to a differentiated TDC output in a feedback loop which can be proportional to a frequency difference between the frequency word 102 and the differentiated TDC output.

The digital loop filter 122 can generate a filtered phase error signal by low-pass filtering the phase error signal. The DCO can generate a periodic DCO signal at a specified frequency from the filtered phase error signal, where the filtered phase error signal can be used to converge the DCO frequency to the specified frequency. The DCO can provide the functionality of a digital-to-analog converter (DAC) 124 and a voltage-controlled oscillator (VCO) 126. Alternatively, the DAC can convert the filtered phase error signal into a voltage input for a VCO, and the VCO can generate a periodic VCO signal 106 at a specified frequency, where the voltage input can be used to converge the VCO frequency to the specified frequency. The TDC can be configured to generate a TDC output signal from the DCO signal 106 (or VCO signal) and the reference signal 104. The differentiator can generate the differentiated TDC output by differentiating the TDC output signal.

A bottleneck in the DPLL performance can be a time-to-digital converter's (TDC) linearity and resolution. A state-of-the-art flash TDC (e.g., Vernier TDC or interpolating TDC) can be limited to a resolution (DNL) of approximately 3-5 picoseconds (ps) and un-compensated linearity (INL) of approximately 8-10 DNLs, which can result in integrated phase noise (iPN) of approximately −30 dBc and large spurs (e.g., greater than −60 dBc). Post distortion techniques can be employed to improve the INL and reduce the iPN to approximately −40 dBc, which is still worse than the iPN of a Gbps wireless standard.

Differential nonlinearity (DNL) can describe the deviation between two analog values corresponding to adjacent digital input values. Integral nonlinearity (INL) can describe a maximum deviation between an ideal output of a circuit (e.g., TDC or a digital-to-analog converter (DAC)) and an actual output level (after offset and gain errors have been removed). INL can be used as a specification for measuring error in a digital circuit, such as a TDC.

In an example, a re-circulating stochastic TDC (rcsTDC) is capable of a resolution of approximately 50 femtoseconds (fs) while covering a required dynamic range of approximately 200 ps, which can meet an iPN<−45 dBc requirement (or recommendation). A drawback of a rcsTDC structure is that the rcsTDC stores and processes a large amount of data (e.g., approximately 3000-6000 bits) where memory cells toggled at the LO frequency (e.g., approximately 6 GHz for IEEE 802.11ac). As a result, a rcsTDC implementation can use a large area of a die and can be power hungry (e.g., consume approximately 50-100 [mW]) for low power applications, such as wireless devices.

Figure 2:
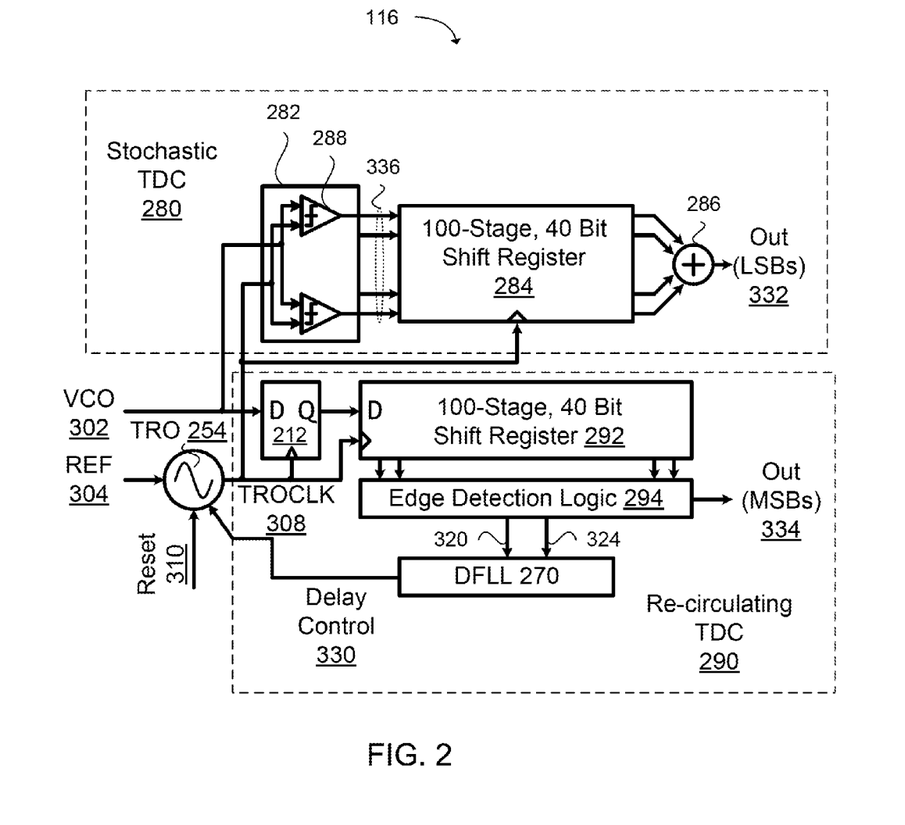
FIG. 2 illustrates a diagram of a re-circulating stochastic time-to-digital converter (rcsTDC) in accordance with an example.

FIG. 2 illustrates a schematic of an rcsTDC architecture with a 100-stage, 40-bit shift registers, which can provide higher resolution than a re-circulating TDC (rcTDC), but use a larger die area and have a high power consumption. The re-circulating TDC can be used to provide time-to-digital conversion with reduced TDC non-linearity. The re-circulating TDC can provide an area efficient, low-power, scalable TDC with reduced process, voltage and temperature (PVT) variation sensitivity. However, the re-circulating TDC can require more cycles to complete a conversion. On the other hand, the conversion must be completed by the time the next reference edge arrives to avoid sub-sampling in the TDC. Therefore, the re-circulating TDC architecture can suffer from a limit on a finest achievable resolution.

In an example, the re-circulating TDC can re-use a single delay cell and sampling flip-flop for the time comparison. In another example, the delay cell can be configured as a triggered ring oscillator with a fixed period which can be slightly shorter or longer than VCO/DCO period. Through reusing the delay cell the TDC can achieve linear characteristics with a much smaller area and power consumption compared with a conventional TDC, such as the Vernier TDC. In another configuration, the frequency locking used for the triggered ring oscillator period adjustment can be performed in digital domain and thus the triggered ring oscillator period adjustment can be automatically calculated and routed to the triggered ring oscillator. In another example, the embedded counting system of the TDC can minimize the power consumption and area overheads of a frequency locking mechanism.

For the re-circulating TDC, the ring oscillator period can be shorter or longer than the VCO period. The ring oscillator period $T_{ref.ring}$ can be represented by $(N_s \pm 1)/N_s * T_{VCO}$, where $T_{VCO}$ is the VCO period, $N_s$ is a TDC sample number, and the TDC sample number is a positive integer of samples of TRO cycles per a reference period. For a re-circulating TDC with a resolution of B-bits, the TDC sample number $N_s$ can be represented by $2^B$. For a B-bit re-circulating TDC, $T_{ref,ring}$ can be set to $(2^B \pm 1)/2^B \cdot T_{VCO}$ and ring oscillator period may be automatically adjusted with respect to the ADPLL VCO frequency. Without loss of generality, $T_{ref,ring}$ can be set to $(2^B \pm 1)/2^B \cdot T_{VCO}$. In another example, $(2^B+1)/2^B \cdot T_{VCO}$ may be used. By monitoring an instantaneous VCO period $T_{pn}$ normalized to the TDC resolution ($T_{VCO}/2^B$), the ring oscillator period $T_{ref,ring}$ can be adjusted to a correct value. The operations to set the correct value for $T_{ref,ring}$ can easily be performed in digital domain such as with a programmed processor.

Figure 3A:
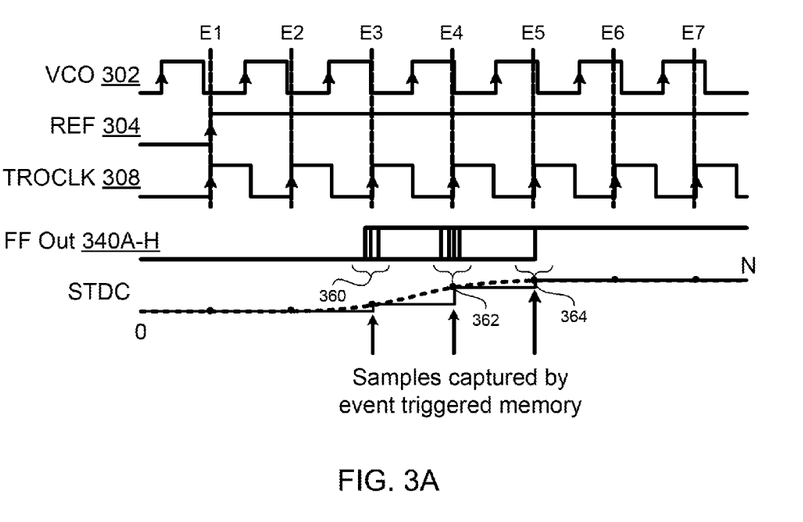
FIG. 3A illustrates a timing diagram of sampling a voltage-controlled oscillator (VCO) signal for a stochastic time-to-digital converter (sTDC) process using a periodic triggered ring oscillator (TRO) clock signal in accordance with an example.
Figure 3B:
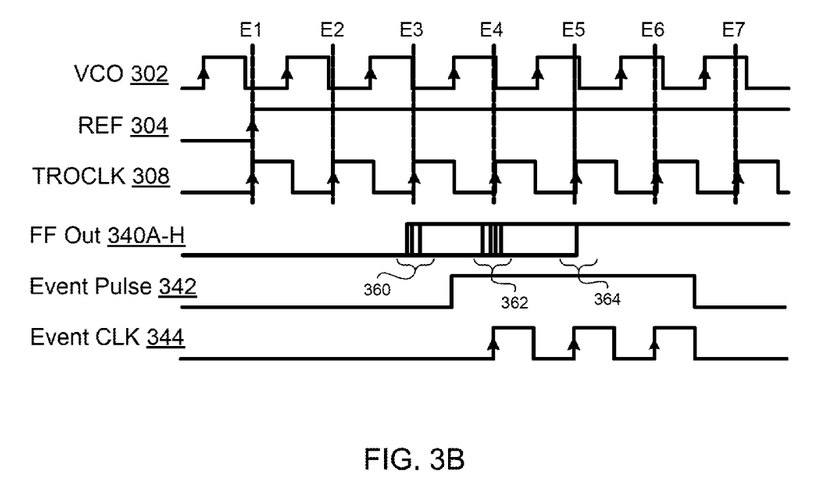
FIG. 3B illustrates a timing diagram of sampling a voltage-controlled oscillator (VCO) signal for a stochastic time-to-digital converter (sTDC) process using an event driven memory in accordance with an example.

If the ring oscillator period, $T_{ref,ring}$ (e.g. TROCLK 308), is adjusted to $(1-1/N_s) \cdot T_{VCO}$, then the time difference between the VCO/DCO 302 and reference ring oscillator (or triggered ring oscillator [TRO]) reduces by $(1/N_s)T_{VCO}$ every cycle, as illustrated in FIGS. 3A-3B. So, $(1/N_s)T_{VCO}$ can be the effective resolution of the re-circulating TDC (rcTDC). A flip-flop (similar to D-flip-flop 212 of FIG. 2) samples the VCO/DCO state against the reference ring transitions 308 and stores the results in a shift register (similar to shift register 292 of FIG. 2, but with fewer bits per stage). Up to q (>=Ns) samples can be required in order to capture the dynamic range required to support fractional-n operation (one complete VCO/DCO period). After q samples are collected, the reference ring is reset 310 and awaits the next reference edge 304. Through reusing the delay cell the TDC can achieve perfectly linear characteristic with a much smaller area and power consumption compared to a conventional TDC. In order to support a finer resolution, the period of the reference ring oscillator can be made closer to the VCO/DCO period. However, the finer resolution can require more cycles to complete the conversion.

To speed up an initial frequency acquisition, the reference ring oscillator can be characterized at a few discrete tuning settings by triggering the reference ring oscillator (ref. ring OSC) and measuring the frequency of oscillation through a counter with respect to the reference frequency (e.g., crystal oscillator frequency or XTAL frequency). The edge detection logic can provide a digital representation of a VCO/DCO period 320 and a delay 324 of the VCO/DCO signal 302 relative to the periodic TRO signal (e.g. TROCLK 308). The digital representation of the VCO/DCO period and the delay can be used as an input for a frequency-locked loop (FFL) 270 used to provide frequency control 330 for the TRO 254. Frequency-locked loops (FLL) can used in radio, telecommunications, computers and other electronic applications to generate stable frequencies, or to recover a signal from a noisy communication channel.

The frequency measurement can be performed in production testing or on a power up of the reference ring oscillator and stored on a memory (e.g., a read-only memory [ROM] or a random access memory [RAM]). From settings derived from frequency measurements, an initial estimation for a desired channel frequency can be interpolated. The initial estimation and interpolation can reduce the amount of time used for a frequency locking loop to converge.

The re-circulating TDC may also prevent a feedback loop of a reference ring control signal 330 and/or a feedback loop of a PPL from locking to the other stable equilibrium point of $(2^B+1)/2^B \cdot T_{VCO}$, which can also be used when the phase measurements are inverted. The TROCLK can be sampled on quadrature phases of the VCO/DCO in a quadri-correlator to determine which of the two frequencies (i.e., a VCO/DCO signal frequency or a periodic ring oscillator signal frequency) is higher and maintaining one signal frequency higher than the other signal frequency. For example, the re-circulating TDC can reset $T_{ref,ring}$ to a minimum delay setting if $T_{ref,ring}$ drifts to become larger than $T_{VCO}$.

FIG. 2 illustrates a diagram of a re-circulating stochastic TDC (rcsTDC) 116 with a stochastic TDC (sTDC) 280. The sTDC can include of an array 282 of logic units or decision units 288 such as flip-flops or latches called arbiters (ARBs) and an encoder and/or adder (not shown) to store values (e.g., VCO state values). The plurality of decision units 282 can include a flip-flop, comparator, latch, arbiter, register, or adder. The sTDC can be based on the stochastic properties of materials, for example each arbiter from the set, given the same input signals, $F_{REF}$ 302 and $F_{CKV}$ 308, can react differently because the arbiters exhibit finite random mismatches resulting from process variations. Some of the arbiter's output can yield 1's and some of the arbiter's output can yield 0's, even if the two input edges are lined up equally.

The input can be modeled as a probability density function because the inputs ($F_{REF}$, $F_{CKV}$) can arrive in a random order exhibiting a Gaussian distribution. Based on the number of ones and zeros, the time difference (FREF-FCKV) between the rising edges of signals can be digitized as an output 336. The digitized value can be sufficiently linear due to an inherent statistical distribution of process variations. The improved resolution due to the sTDC can result in a phase lock loop (ADPLL) with an improved total jitter.

In an example, the VCO/DCO signal 302 can be fed to a data port ($F_{REF}$) of the array and the reference ring signal 308 can be fed to a clock port ($F_{CKV}$). In the presence of variations, the sampling instant of each flip-flop can be skewed from a nominal (N) or mean of the observations as measured at output port 336. When the VCO/DCO and reference ring signals (rising edges or $F_{REF}=F_{CKV}$) are aligned, then statistically, half the flip-flops can resolve a "1" and half a "0". As time sweeps the distance between the edges more (or less) flip-flops will resolve to a "1", as illustrated by a flip-flop output (FF OUT) 340A-H or 336 (FIG. 2) for event 3 through event 5 (E3-E5), shown in FIGS. 3A-B.

For large distances between the edges (such as when $|F_{REF}|>>|F_{CKV}|$) all the flip-flops will resolve a "1" (e.g., E6-E7) or "0" (e.g., E1-E2) depending on the polarity of the difference. The outputs of all the flip-flops for the stage can be averaged in order to decode the output. The resolution of the stochastic TDC can be set by a number of latches (e.g., flip-flops) in the array while the dynamic range can be limited by the width of the tails of the statistical distribution. The flip-flops can be a minimal size to maximize the variations and minimize power consumption. The stochastic TDC can exploit process variations and mismatch to achieve a very fine resolution with limited dynamic range. The resolution can set by the number of flip-flops (arbiters). The dynamic range can be limited by the width of the probability distribution.

FIG. 2 illustrates the operation of a re-circulating stochastic TDC 116. In the illustrated example, the dynamic range is segmented between the re-circulating TDC (rcTDC 290) and the stochastic TDC (sTDC 280). The sTDC can serve as a least significant bit (LSB) 332 of the TDC output and rcTDC can serve as the most significant bit (MSB) 334 of the TDC output. The rcTDC can measure the difference between a reference edge (TROCLK 308) and a nearest VCO/DCO edge (VCO/DCO 302) with a coarse resolution and covers delays of up to one VCO/DCO period. The sTDC can provide the fine resolution where the resolution of time detection can increase beyond a single inverter delay, which can be a best resolution that can be expected from an inverter chain approach used in a coarse loop. The sTDC can cover a dynamic range a little greater than the re-circulating TDC step size (resolution) in order to have sufficient overlap. For most of the conversion steps, the difference between the two edges can be so large that the stochastic TDC is saturated at "1" or "0". As the two edges get closer, the stochastic TDC can produce finer intermediate measures. The TDC 116 can detect (e.g., output 336) at the sTDC and capture (e.g., register 284) the finer intermediate measurements in order to minimize the data storage requirements. The outputs of the two TDCs (e.g., sTDC and rcTDC) can get combined (e.g., adder of the MSB 334 and LSB 332 (not shown)) with appropriate gain scaling to obtain a high resolution output for a TDC output. The required gain scaling can be easily extracted from the finer measures of the stochastic TDC since finer measures were captured at delays separated by the coarse TDC steps.

When the two input ports (edges of $F_{REF}$ and $F_{CKV}$) have a considerably large phase error between them, then all of the latches can unambiguously state edge $F_{REF}$ (VCO/DCO 302) comes earlier than edge $F_{CKV}$ (TROCLK 308), which can be represented by a 0 (E1 or E2) at the latch outputs 336 (or FF OUT 340A-H), or all of the latches can unambiguously state edge $F_{CKV}$ (TROCLK 308) comes earlier than edge $F_{REF}$ (VCO/DCO 302), which can be represented by a 1 (E6 or E7) at the latch outputs 336 (or FF OUT 340A-H). A saturation condition can occur when all the latch output are either 1 or 0, where the inputs represent a timing error beyond a sTDC dynamic range. In the saturation condition, the TDC uses the coarse values from rcTDC 290.

An adder 286 combines the output of register 284 into a single stream (LSB), while logic 294 combines the values from shift register 290 into another stream (MSB). The logic 294 and/or the DFLL 270 can generate reset 310 and delay control 330.

The rcTDC 290 and sTDC 280 can be used in wireless radio transceivers for high data-rate standards, such as a third generation partnership project (3GPP) long term evolution (LTE) standard (e.g., 4G(LTE)/5G(LTE-Advanced) cellular), a WiMAX (Worldwide interoperability for Microwave Access or the Institute of Electrical and Electronics Engineers (IEEE) 802.16 standard (e.g., 802.16e, 802.16m)), and a WiFi (IEEE 802.11 standard (e.g., (802.11ac, 802.11ad)). The rcTDC and sTDC can be used to generate a radio frequency (RF) and used in both stand-alone radios or as part of a system-on-chip (SoC) incorporating one or more wireless protocol. Within a transceiver, rcTDC and sTDC can be used in an all-digital frequency synthesizer for local oscillator (LO) generation forming a linear transceiver that can also be used in a wireless digital transmitter for phase modulation.

As shown in FIG. 2, each comparing flop (e.g., flip-flop) in the stochastic TDC 280 can require a full shift register (e.g., approximately 100 stages for 6-bit course resolution) to capture the flop state (e.g., VCO state) at each time sample. In an example, the sTDC can use 40 bits for each VCO state to generate an up to an approximately (~) 5-bit fine resolution. As a result, the shift register 284 for the sTDC can use approximately (~) a number of stages times a number of stochastic flops (e.g., 100 stages×40 bits/stage=~4000 bits in FIG. 2). In an example, the number of stages can determine the course resolution (MSB), and the number of latches or bits per stage can determine the fine resolution (LSB). So, for a high resolution rcsTDC, the number of flops can be large. All the flops can run at VCO sampling rate, which can result in a large power consumption. In addition, the decoding circuit used to interpret the data can also process a large number of bits (e.g., 4000 bits), which can be area and power consuming and can consume timing margins from the DPLL.

A stochastic beating TDC (sbTDC) can be implemented, instead of the rcsTDC, which can operate at very low power (e.g., ~5[mW]) and occupy relatively small area of the die without sacrificing range and resolution. The sbTDC can include (1) a stochastic TDC (sTDC) with an event driven memory, (2) multi-phase sampling, (3) a circular counter (e.g., linear feedback shift register (LFSR)) for an event counter, and/or (4) an automatic gating circuit to reset the sbTDC after each conversion.

Figure 4:
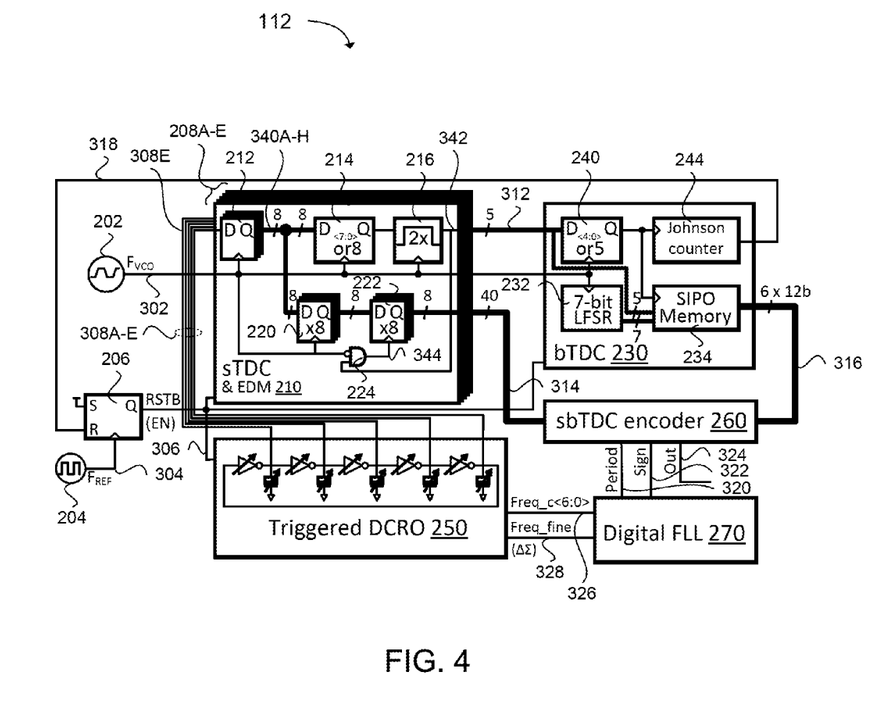
FIG. 4 illustrates a schematic diagram of a stochastic beating time-to-digital converter (sbTDC) architecture in accordance with an example.

Referring back to FIG. 3A, the stochastic comparing flops may only have meaningful data around a point the VCO 302 and triggered ring oscillator (TRO or TROCLK 308) edges cross each other. The crossover of the VCO and TRO edges can be referred to as a transition edge (e.g., E3-E5 of FF Out 340A-H for 8 latches). Each of the latches (e.g., flops) for a stage can have a different transition edge within a specified duration, such as three events or VCO states (e.g., event 3 (E3) through event 5 (E5) of FIGS. 3A-B). The event or the VCO state can be determined by the VCO 302 signal on a data port and the TRO signal (TROCLK 308) on a clock port of the latch, as shown in FIGS. 2, 3A-3B, or the event or the VCO state can be determined by the TRO signal (TROCLK 308) on the data port and the VCO 302 signal on the clock port of the latch, as shown in FIG. 4. Putting the TRO signal (TROCLK 308) on the data port can simplify the sbTDC design when multiple phases of the TRO signal are used, but can be performed when different TRO phases are used to sample the VCO. The meaningful data can occur from the first latch (e.g., 360 or E3 of FF Out 340A-C) to transition to the last latch (e.g., 364 or E5 of FF Out 340H) to transition to a different digital state. Transitions in FIGS. 3A-B are shown to occur on a rising edge, but in other examples (not shown) transitions can occur on a falling edge. The meaningful data can include a selected number of VCO states capturing the transitions of all the latches for the stage, which can be less than five VCO states (e.g., 3 VCO states in FIGS. 3A-3B). As used herein, the event can be used interchangeably with the VCO state, a DCO state, or a sample.

During the rest of the time or events (e.g., E1-E2 or E6-E7), which can actually be most of the time samples or VCO states, the outputs (FF Out 340A-H) can be identical (e.g., all zeros or all ones) for all the stochastic comparing flops. Thus, instead of capturing all the stochastic flops at all the time samples or VCO states, capturing the state of flops around the crossing event (e.g., 360, 362, and 364 or E3-E5 of FF Out 340A-H) can provide the information used for the stochastic estimation or stochastic determination. Event 3 (E3) can represent the transition of 3 flops (FF Out 340A-C) in a stage, event 4 (E4) can represent the transition of 4 more flops (FF Out 340D-G) in the stage, and event 5 (E5) can represent the transition of 1 more flop (FF Out 340H) or the rest of flops in the stage. Events 1 and 2 (E1-E2) can represent a saturation state at a zero digital state for the flops in the stage, and events 6 and 7 (E6-E7) can represent a saturation state at a one digital state, which may not be used in the stochastic determination. Since the stochastic TDC range can be designed to be larger than an LSB step (or stage) of a beating TDC (bTDC), sTDC can take more than one VCO state for all the stochastic flops to complete the transition. The sTDC can be used to capture the transition event by generate a trigger signal to memory cells that capture the state of relevant group of latches at the event and following events (i.e., event driven memory).

To detect a transition event, an OR function 214 on the flops 212 output can be used to detect an initial transition event on the stochastic flops, and the OR function 214, 216, and 224 can be used to generate save pulses event CLK 344 (FIGS. 3B and 4) that can trigger a memory 234. The state of the OR can be stored in a shift register 212, 220, 222 to encode the beating TDC state (in a sbTDC encoder 260). The sTDC with an event driven memory can result in profound reduction in the number of memory flops to ~100 for the OR shift register and another ~4-6×number (no.) of flops for the stochastic data, which can result in a profound area and power reduction.

The sTDC can include one sTDC component to compare the VCO 302 signal to the TRO signal (TROCLK 308E), or the sTDC can include multiple sTDC components to compare the VCO 302 signal to multiple phases of the TRO signal (TROCLK 308A-E). FIG. 4 illustrates 5 phases of the TRO signal 308A-E, and 5 sTDC components 208A-E in the sTDC for each phase of the TRO signal. Using a single sTDC component in the sTDC can be problematic because driving a big group of latches FF on one node (e.g., TRO) may cause the TRO generation to fail. Multiple phases of the TRO can improve performance because the number of latches driven by each TRO signal phase can be reduced.

Each sTDC can include a set of latches (e.g. data flip-flops (D-FF)) 212 to capture the VCO state at each event, which can be used for stochastic determination. FIG. 4 illustrates 8 latches 212 used for each event. The "8" on the output of the latches 212 represents a bus of 8 separate outputs from each stochastic latch. Similar notations are used in FIG. 4 to indicate other bus sizes. The input set of latches 212 can capture the TRO signal 308A-E at a VCO edge (e.g., VCO state). In an example, the OR function can include an OR gate 214 on the outputs of the input set of latches to capture a first transition of one of the latches 212 in another latch 214 (e.g., trigger latch). An edge differentiator 216 (e.g. "×2") along with the trigger latch 214 can generate an event pulse 342 for capturing the selected number of VCO states when all the latches transition. FIG. 4 illustrates the edge differentiator with a pulse width of 2 VCO states (or TRO cycles), which can include 2 FF delaying the OR result from the trigger latch and some simple logic. The event pulse 342 can be combined with an inverted VCO signal 302 in an AND gate 224 to generate an event capture of the VCO states of the transition latches 222. The selected number of VCO states (e.g., 3 events for the transition) for the set of latches (e.g., 8 latches per state) for each sTDC component (e.g., 5 sTDC components for the sbTDC) can processed by the sbTDC encoder 260. In the example of FIG. 4, each component can generate 8 stochastic flop values for each event, so 40 flop outputs 314 can be coupled to the sbTDC encoder for the 5 sTDC components.

Figure 5:
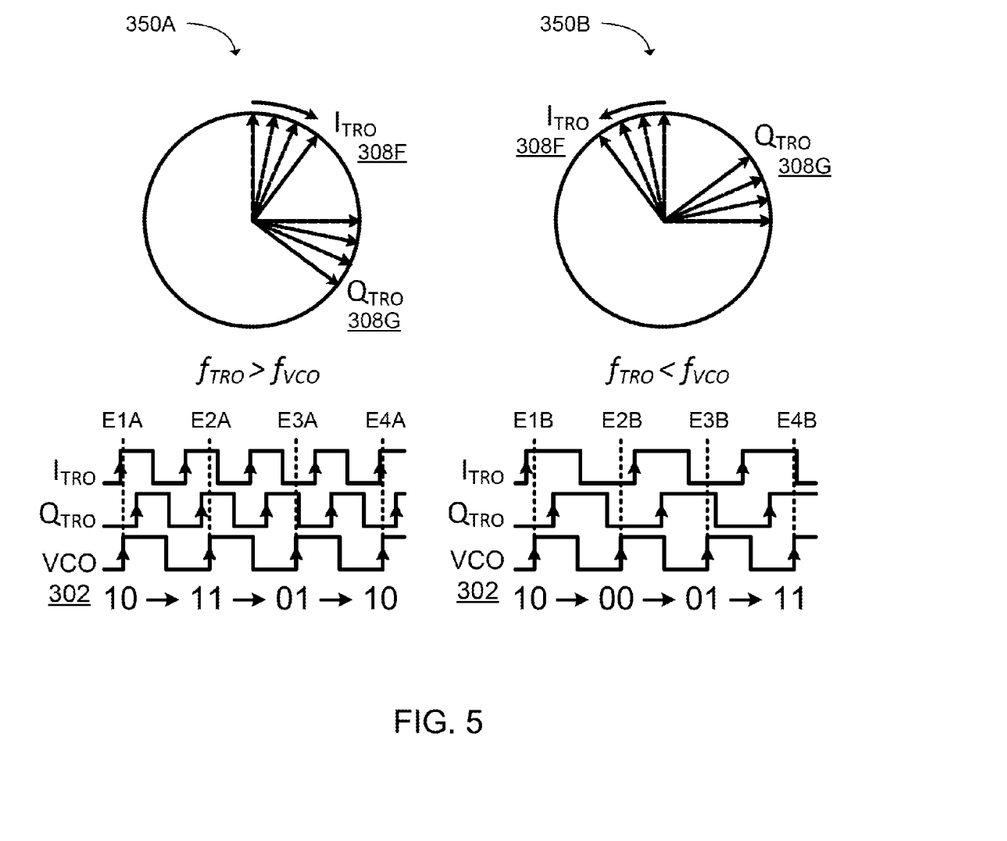
FIG. 5 illustrates a diagram of polarity detection using multi-phase sampling for a stochastic beating time-to-digital converter (sbTDC) in accordance with an example.

The beating TDC (bTDC) can provide a course resolution and polarity detection (i.e., to determine which oscillator [e.g., TRO or VCO] is faster) in order to properly closed the loop between the VCO and TRO. The multiple phases of the VCO or TRO can be compared in order to detect the polarity, as illustrated in FIG. 5. FIG. 5 represents a comparison of two phases (e.g., $I_{TRO}$ and $Q_{TRO}$) of quadrature phases of the TRO signal generated by a triggered digitally controlled ring oscillator (T-DCRO). When a TRO signal frequency is faster than a VCO 302 signal frequency (i.e., $f_{TRO} > f_{VCO}$) 350A, the TRO has a shorter pulse width, and $Q_{TRO}$ 308G can lead $I_{TRO}$ 308F in a clockwise direction, which can generate a digital pattern (10, 11, 01, 10; or 2, 3, 1, 2) that is distinct from the case when the TRO signal frequency is slower than the VCO signal frequency (i.e., $f_{TRO} < f_{VCO}$) 350B. When $f_{TRO} < f_{VCO}$, the TRO has a longer pulse width, and $I_{TRO}$ 308F can lead $Q_{TRO}$ 308G in a counter-clockwise direction, which can generate a distinct digital pattern (10, 00, 01, 11; or 2, 0, 1, 3). The distinct digital pattern generated by the different phases can be used for polarity detection.

Figure 6:
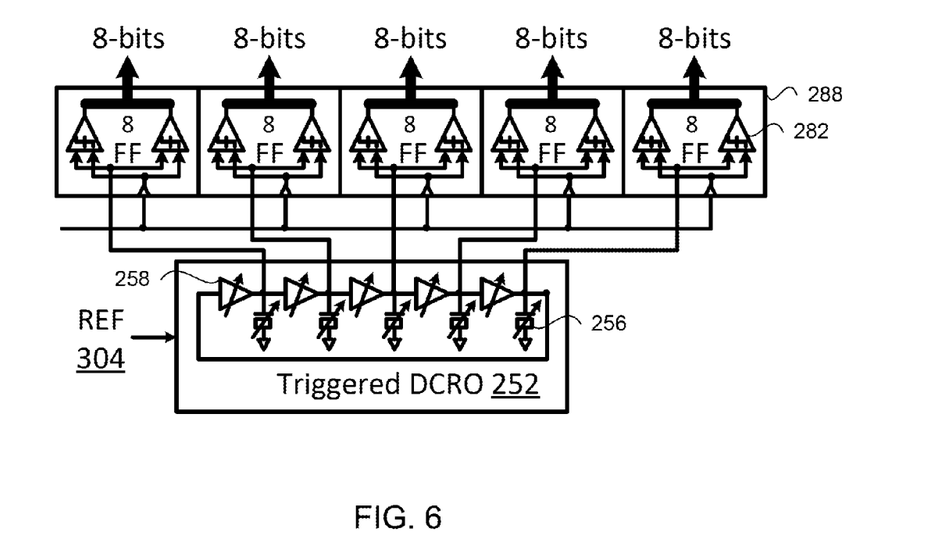
FIG. 6 illustrates a diagram of distributed multi-phase sampling of a stochastic beating time-to-digital converter (sbTDC) in accordance with an example.

The polarity detection can be embedded into the sbTDC circuit by distributing the stochastic TDC along the stages of the TRO (e.g., triggered DCRO 252), as shown in FIG. 6. The triggered DCRO can be a combination of enabled inverters 258 and capacitor bank 256. The triggered DCRO allows balancing the load of each TRO stage and not loading all flops on one node. Although FIG. 5 illustrates polarity detection for quadrature phases of the VCO, polarity detection can be extended to any number of phases (e.g., 5 phases), as shown in FIG. 6. In an example, polarity detection can be determined by a sbTDC encoder. Beyond embedding the polarity detection, without requiring extra circuits, polarity detection using the digital pattern and/or an automatic gating circuit can shorten the period detection time to 1+1/(no. of TRO stages), which can result in shorter operation time of the sbTDC and thus less power.

FIG. 4 exhibits a schematic view of the sbTDC with the multiple phases, which can include the sTDC with the event driven memory, multi-phase sampling, the event counter, and the automatic gating circuit. Instead of using a 100-stage shift register on the OR of the stochastic flops, a counter (e.g. 7 flops LFSR counter 232) can be used to count the number of times samples pass until each transition event. The counter can result in further reducing of the number of required flops that run at the VCO frequency, thus further lowering the power consumption of the circuit. The LFSR state can be captured in a memory cell of the memory 234 at every event detected by the OR on every tap of the TRO, where a tap represents a phase of the TRO. In the example in FIG. 4, the LFSR can have a 7 bit output. In an example, the memory can be configured as a serial-in, parallel-out (SIPO) memory with 6×12 bit output 316 for the sbTDC encoder, where 7 bits represent the counter value and 5 bits represent the TRO phase of each transition event. The sbTDC encoder 260 can receive data from the sTDC 210 and the bTDC 230 to generate a digital representation of the VCO period 320, the sign 322 (e.g., polarity), and, the delay out 324 for the VCO relative to the reference signal 304.

The automatic gating circuit can be used to reset the sbTDC after each time-to-digital conversion. The sbTDC can start the detection operation with every edge (e.g., rising edge) of the reference clock. Once the circuit detects two transition event occurring at any tap (i.e., full period completed at that tap), the circuit can generate a reset signal that stops the sbTDC operation and holds the data until the next edge of the reference clock. The automatic gating circuit allows minimizing the convergence time of the operation of the sbTDC to what is required to resolve the data.

For example, the automatic gating circuit can include a latch that pulses with each event pulse 342 of the sTDC 210. A counter (e.g., Johnson counter) can count 6 pulses (i.e., representing a full period of one of the phases) and generate a signal 318 for set-reset (SR) NOR latch 206 to generate set/reset signal 306 for the sbTDC.

In an example, the sbTDC can have a similar power consumption to a flash TDC (e.g., 4 mW), but with a much finer resolution of ~50 fs. The sbTDC can have low power consumption, small footprint on a die area, and/or a high resolution.

Referring back to FIG. 4, a stochastic beating time-to-digital converter (sbTDC) 112 can include a triggered ring oscillator (TRO), a stochastic TDC (sTDC) 210, a beating TDC (bTDC) 230, a stochastic beating TDC (sbTDC) encoder 260, and a digital frequency-locked loop (DFLL) 270. The TRO (e.g., a triggered digitally controlled ring oscillator (triggered DCRO) 250), when triggered by a reference signal 304 edge, can generate a periodic TRO signal 308E with a TRO period that is a selected ratio of a voltage-controlled oscillator (VCO) period. The TRO period can be greater than or less than the VCO period by the specified ratio. The sTDC with an event triggered memory (or event driven memory (EDM)) can include an sTDC component 208A-E with a plurality of groups of latches (e.g., delay flip-flops (D flip-flops) 212, 220, and 222). Each group of latches can be configured to sample and store a VCO state at an edge of a TRO signal, and the sTDC component triggers a capture of a select number of VCO states of the group of latches when one latch 212 in the group of latches transitions to a different digital state referred to as a transition edge. The edge can either be a rising edge or a falling edge of a signal (e.g., the TRO signal or the reference signal). The reference signal can be generated by a reference signal generator 204.

In an example, a beating TDC (bTDC) 230 can count a number of the TRO periods from the reference signal 304 edge (E1 of FIGS. 3A-B) to each transition edge (E3 of FIGS. 3A-B). A transition edge can represent an event when a state of one latch in the group of latches transitions to a different digital state. The bTDC can include a circulating counter (e.g. a linear feedback shift register (LFSR) 232) to count each VCO state, and a memory (e.g., a serial-in parallel-out (SIPO) memory 234) for capturing count values of the circulating counter at an event edge of one latch in a group of latches and a subsequent event edge of one latch in the group of latches. In another example, the bTDC can include an automatic gating circuit can be configured to hold the captured count values and the captured selected number of VCO states until a subsequent trigger of a reference signal, and to reset 306 the TRO 250, the sTDC 210, and the bTDC 230 after two event edges of one of the sTDC components 208A-E. The event edge and the subsequent event edge can include a rising transition edge or a falling transition edge. In another configuration, the automatic gating circuit can include a Johnson counter 244 and a set-reset (SR) NOR latch 206.

In another example, the TRO includes a triggered DCRO to generate multiple phases (e.g., 5 phases 308A-E) of the periodic TRO signal. The sTDC includes a plurality of the sTDC components 208A-E. Each sTDC component uses a phase 308E of the periodic TRO signal. The bTDC digitally adds, using an OR circuit 240, the number of the TRO periods from the reference signal 304 edge to each transition edge of each sTDC component.

In another example, the stochastic beating TDC (sbTDC) encoder can generate digital representations of the VCO period, and a polarity and the delay of a VCO signal 302 relative to the periodic TRO signal 308E. The sbTDC encoder can generate least significant bits (LSB) for the digital representations derived from the captured selected number of VCO states from the sTDC 210, the sbTDC encoder can generate most significant bits (MSB) for the digital representations derived from the captured count values from the memory of the bTDC 230, and the sbTDC encoder can generate the polarity from the digital sequence of the multiple phases 308E of the periodic TRO signal captured by the count values. The polarity can determine when the periodic TRO signal has a frequency higher or lower than the VCO signal.

In another configuration, the DFLL 270 can control the frequency of the periodic TRO signal 304 for the triggered DCRO 250 using the period 320 and the polarity (e.g., sign 322) generated by the sbTDC encoder 260. The DFLL can provide to the triggered DCRO a coarse resolution (or lower resolution or MSB) value 326 (e.g., 7 bits—<6:0>) and a fine resolution (or high resolution or LSB) value 328 based on an estimate ($\Delta\Sigma$) derived from the sTDC.

In another example, the TDC can have a resolution of M-bits represented by $2^M$, where M=B+C, and B and C are positive integers. The number of VCO states for the VCO period $N_s$ can represented by $2^B$ which can used to generate the MSB, and C-bits can be derived from the sTDC used for the LSB. The TRO period can be represented by $N_s-1$ or $N_s+1$. One of the group of latches 212 configured to store the VCO state can use the periodic TRO signal 308E as an input to the latches, and clocks the latches using the VCO signal 302 from a digitally controlled oscillator (DCO) 202 or VCO. The selected number of VCO states can be less than five VCO states (e.g., 3 VCO shown in FIGS. 3A-B and 6), and the transition edge can be a rising edge transition. In an example, the TDC can have a resolution between 50 femtoseconds (fs) and 1 picosecond (ps) with an integrated phase noise (iPN) less than −45 decibels relative to a carrier (dBc) and an operating power of less than 10 milliwatts (mW). In another configuration, the TDC can be configured in a phase locked loop (PLL), such as the all-digital phase locked loop (AD-PLL) 100 (FIG. 1), to generate a clock frequency within a band of an Institute of Electrical and Electronics Engineers (IEEE) 802.11ac or 802.11 ad standards, IEEE 802.16e or IEEE 802.16m-2011 standards, or third generation partnership project (3GPP) long term evolution (LTE) standard Release 8, 9, 10, or 11.

In another example, the TDC (e.g., sbTDC) or the PLL (e.g., ADPLL) can be included in a wireless device or a node. FIG. 11 provides an example illustration of the wireless device, such as an user equipment (UE), a mobile station (MS), a mobile wireless device, a mobile communication device, a tablet, a handset, or other type of wireless device. The wireless device can include one or more antennas configured to communicate with a node, macro node, low power node (LPN), or transmission station, such as a base station (BS), an evolved Node B (eNB), a baseband unit (BBU), a remote radio head (RRH), a remote radio equipment (RRE), a relay station (RS), a radio equipment (RE), a central processing module (CPM), or other type of wireless wide area network (WWAN) access point. The wireless device can be configured to communicate using at least one wireless communication standard including 3GPP LTE, WiMAX, High Speed Packet Access (HSPA), Bluetooth, and WiFi. The wireless device can communicate using separate antennas for each wireless communication standard or shared antennas for multiple wireless communication standards. The wireless device can communicate in a wireless local area network (WLAN), a wireless personal area network (WPAN), and/or a WWAN.

Figure 9:
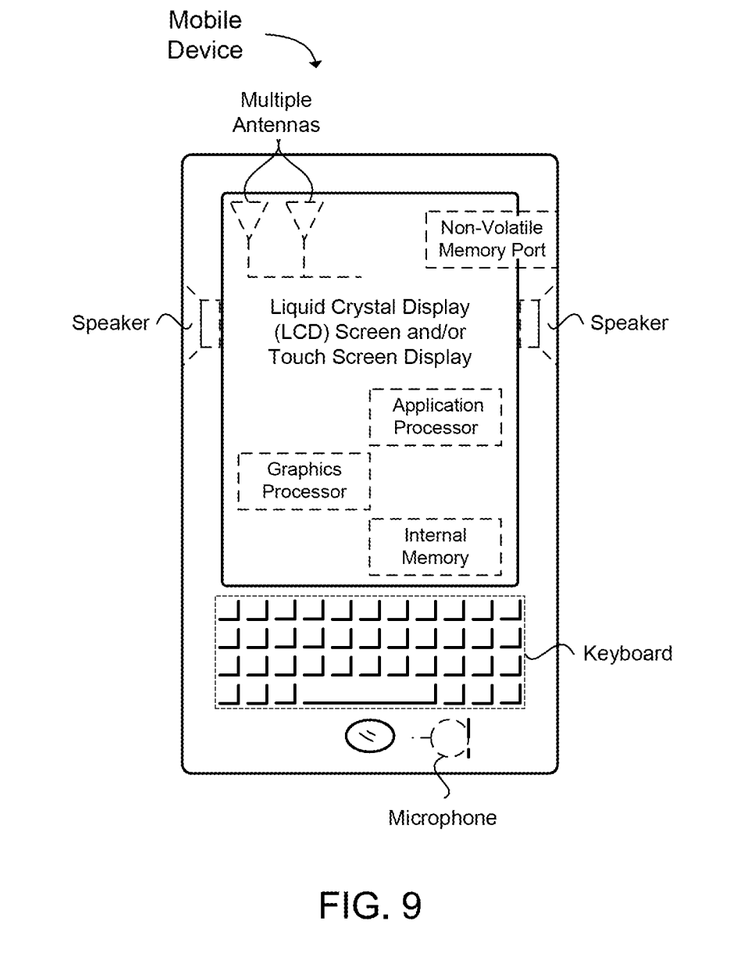
FIG. 9 illustrates a diagram of a wireless device (e.g., UE) in accordance with an example.

FIG. 9 also provides an illustration of a microphone and one or more speakers that can be used for audio input and output from the wireless device. The display screen may be a liquid crystal display (LCD) screen, or other type of display screen such as an organic light emitting diode (OLED) display. The display screen can be configured as a touch screen. The touch screen may use capacitive, resistive, or another type of touch screen technology. An application processor and a graphics processor can be coupled to internal memory to provide processing and display capabilities. A non-volatile memory port can also be used to provide data input/output options to a user. The non-volatile memory port may also be used to expand the memory capabilities of the wireless device. A keyboard may be integrated with the wireless device or wirelessly connected to the wireless device to provide additional user input. A virtual keyboard may also be provided using the touch screen.

Figure 7:
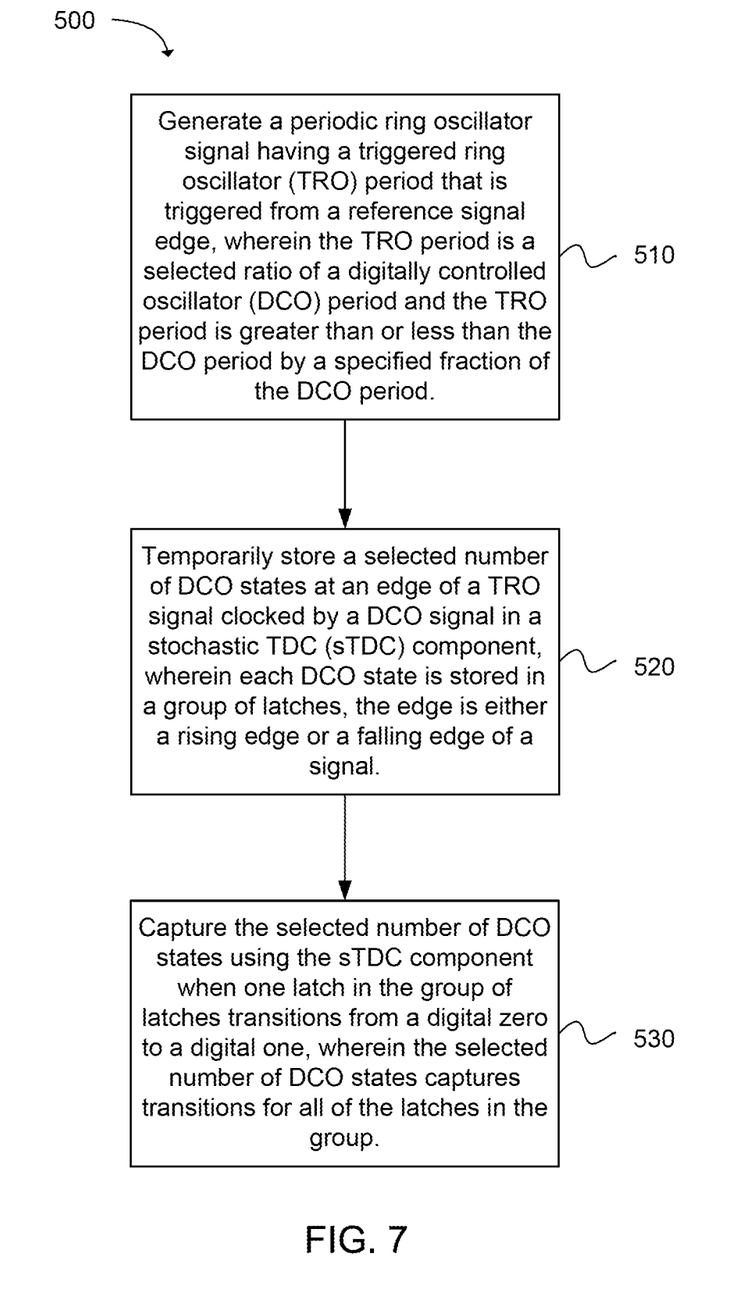
FIG. 7 depicts a flow chart of operations of computer circuitry for a stochastic beating time-to-digital converter (sbTDC) in accordance with an example.

Another example provides a method 500 for stochastic beating time-to-digital conversion, as shown in the flow chart in FIG. 7. The method may be executed as instructions on a machine or computer circuitry, where the instructions are included on at least one computer readable medium or one non-transitory machine readable storage medium. A stochastic beating time-to-digital converter can have computer circuitry to perform the method 500. The computer circuitry can be configured to generate a periodic ring oscillator signal having a triggered ring oscillator (TRO) period that is triggered from a reference signal edge, wherein the TRO period is a selected ratio of a digitally controlled oscillator (DCO) period and the TRO period is greater than or less than the DCO period by a specified fraction of the DCO period, as in block 510. The computer circuitry can be further configured to temporarily store a selected number of DCO states at an edge of a TRO signal clocked by a DCO signal in a stochastic TDC (sTDC) component, wherein each DCO state is stored in a group of latches, the edge is either a rising edge or a falling edge of a signal, as in block 520. The computer circuitry can also be configured to capture the selected number of DCO states using the sTDC component when one latch in the group of latches transitions from a digital zero to a digital one, wherein the selected number of DCO states captures transitions for all of the latches in the group, as in block 530.

In an example, the computer circuitry can be further configured to: Count the DCO states via clocking the DCO signal using a linear feedback shift register (LFSR) in a beating TDC (bTDC); and capture count values of the LFSR in a serial-in parallel-out (SIPO) memory at a rising transition edge of an output of one latch in the group of latches and a subsequent rising transition edge of an output of one latch in the group of latches.

In another example, the computer circuitry configured to generate a periodic ring oscillator signal can be further configured to generate multiple phases of the periodic ring oscillator signal. The computer circuitry configured to store and capture the selected number of DCO states can be further configured to store and capture the selected number of DCO states for each phase of the periodic ring oscillator signal in an sTDC. The sTDC can include a plurality of sTDC components, and each sTDC component can use a phase of the periodic ring oscillator signal as an input signal.

In another configuration, the computer circuitry can be further configured to: Reset the TRO, the sTDC, and the bTDC after two rising transition edges from a sampling output of one of the sTDC components using an automatic gating circuit; and hold the captured count values and the captured selected number of DCO states until a subsequent trigger of a reference signal. The automatic gating circuit can include a Johnson counter to count a rising transition edge from each of the sTDC components. An output of the Johnson counter can be coupled to a latch to perform the reset. The Johnson counter can count a number that is one greater than the number of sTDC components.

In another example, the computer circuitry can be further configured to: Generate a digital representation of the DCO period including period least significant bits (LSB) and period most significant bits (MSB), where the period LSB can be derived using the captured selected number of DCO states from the sTDC and the period MSB can be derived using the captured count values from the SIPO memory of the bTDC; and generate a delay of the DCO signal relative to the periodic ring oscillator signal including delay LSB and delay MSB, where the delay LSB can be derived using the captured selected number of DCO states from the sTDC and the delay MSB can be derived using the captured count values from the SIPO memory of the bTDC; or generate a polarity of the DCO signal relative to the periodic ring oscillator signal from the captured count values from the SIPO memory of the bTDC for at least two of the sTDC components, where the polarity can determine when the periodic ring oscillator signal has a frequency lower than the DCO signal.

In another configuration, the computer circuitry can be further configured to generate the periodic ring oscillator signal for the TRO using the DCO period and the polarity generated by the sbTDC encoder. In an example, the computer circuitry can be configured in a phase locked loop (PLL) to generate a clock frequency in a range of 4.8 to 6 Gigahertz (GHz) with an integrated phase noise (iPN) of less than −45 decibels relative to a carrier (dBc) and an operating power of between 1 and 5 milliwatts (mW).

Figure 8:
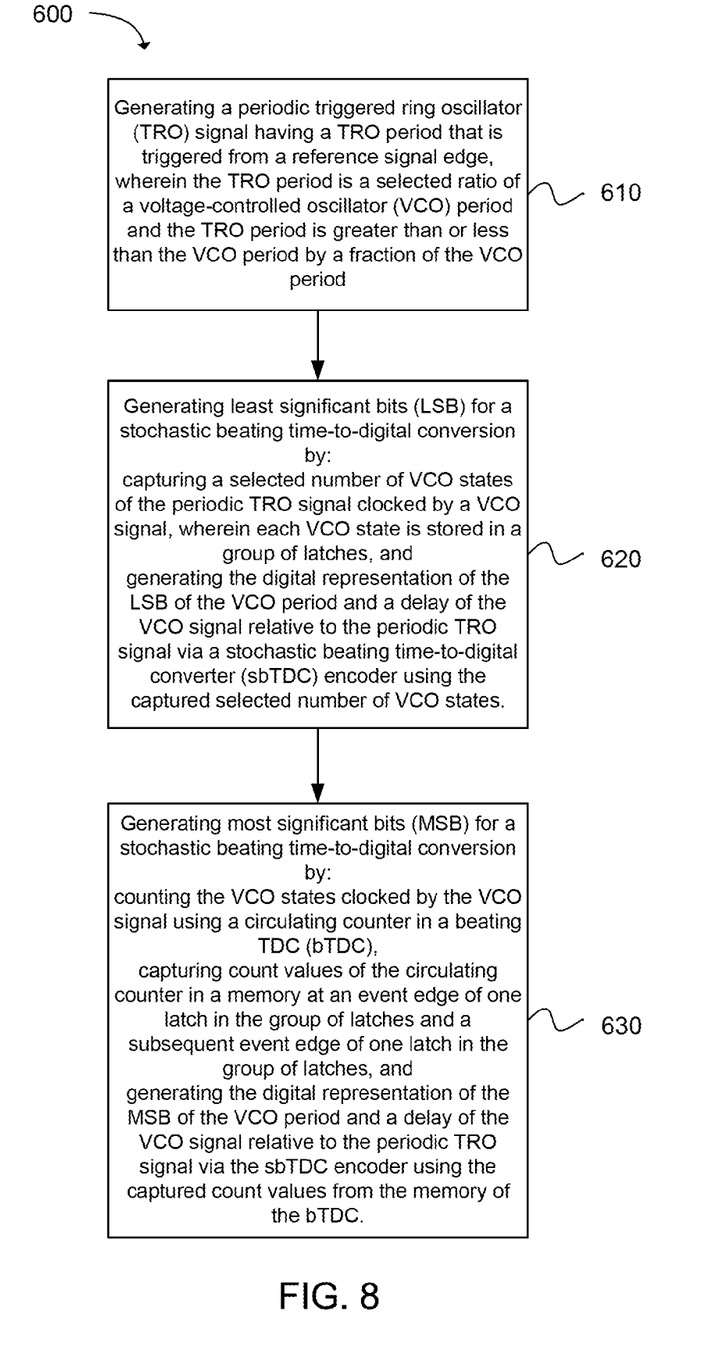
FIG. 8 depicts a flow chart of a method for time-to-digital conversion in accordance with an example.

Another example provides a method 600 for time-to-digital conversion, as shown in the flow chart in FIG. 8. The method may be executed as instructions on a machine or computer circuitry, where the instructions are included on at least one computer readable medium or one non-transitory machine readable storage medium. The method includes the operation of generating a periodic triggered ring oscillator (TRO) signal having a TRO period that is triggered from a reference signal edge, wherein the TRO period is a selected ratio of a voltage-controlled oscillator (VCO) period and the TRO period is greater than or less than the VCO period by a fraction of the VCO period, as in block 610. The operation of generating least significant bits (LSB) for a stochastic beating time-to-digital conversion follows by: Capturing a selected number of VCO states of the periodic TRO signal clocked by a VCO signal, wherein each VCO state is stored in a group of latches, and generating the digital representation of the LSB of the VCO period and a delay of the VCO signal relative to the periodic TRO signal via a stochastic beating time-to-digital converter (sbTDC) encoder using the captured selected number of VCO states, as in block 620. The next operation of the method can be generating most significant bits (MSB) for a stochastic beating time-to-digital conversion by: Counting the VCO states clocked by the VCO signal using a circulating counter in a beating TDC (bTDC), capturing count values of the circulating counter in a memory at an event edge of one latch in the group of latches and a subsequent event edge of one latch in the group of latches, and generating the digital representation of the MSB of the VCO period and a delay of the VCO signal relative to the periodic TRO signal via the sbTDC encoder using the captured count values from the memory of the bTDC, as in block 630.

In an example, the operation of generating a periodic TRO signal can further include generating multiple phases of the periodic TRO signal. The operation of capturing a selected number of VCO states can further include capturing the selected number of VCO states for each phase of the periodic TRO signal. The selected number of VCO states can capture transitions for the latches in the group for each phase.

In another example, the method can further include generating a polarity of the VCO signal relative to the periodic TRO signal from the captured count values from the memory for at least two phases of the periodic TRO signal. In another configuration, the method can further include generating the periodic TRO signal for the TRO using the VCO period and the polarity.

In another example, the method can further include: Transferring the captured count values for an event edge of each phase of the periodic TRO signal to the sbTDC encoder; resetting a TRO generating the periodic TRO signal, the group of latches capturing the selected number of VCO states, and the memory for capturing the count values; and holding the captured count values and the captured selected number of VCO states until a subsequent trigger of a reference signal.

Various techniques, or certain aspects or portions thereof, may take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, solid state drive, or other medium for storing electronic data. The node and wireless device may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system. However, the program (s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" means that a particular feature, structure, or characteristic described in connection with the example is included in at least one embodiment of the present invention. Thus, appearances of the phrases "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A time-to-digital converter (TDC), comprising:
a triggered ring oscillator (TRO) configured, when triggered by a reference signal edge, to generate a periodic TRO signal with a TRO period that is a selected ratio of a voltage-controlled oscillator (VCO) period, wherein the TRO period is greater than or less than the VCO period by the specified ratio; and
a stochastic TDC (sTDC) with an event triggered memory including an sTDC component with a plurality of groups of latches, wherein each group of latches is configured to sample and store a VCO state at an edge of a TRO signal, and the sTDC component triggers a capture of a select number of VCO states of the group of latches when one latch in the group of latches transitions to a different digital state referred to as a transition edge, wherein the edge is either a rising edge or a falling edge of a signal.

2. The TDC of claim 1, further comprising:
a beating TDC (bTDC) configured to count a number of the TRO periods from the reference signal edge to each transition edge, wherein a transition edge represents an event when a state of one latch in the group of latches transitions to a different digital state, comprising:
a circulating counter to count each VCO state; and
a memory for capturing count values of the circulating counter at an event edge of one latch in a group of latches and a subsequent event edge of one latch in the group of latches.

3. The TDC of claim 2, wherein the bTDC further comprises:
an automatic gating circuit configured to hold the captured count values and the captured selected number of VCO states until a subsequent trigger of a reference signal, and to reset the TRO, the sTDC, and the bTDC after two event edges of one of the sTDC components.

4. The TDC of claim 3, wherein the event edge and the subsequent event edge include a rising transition edge or a falling transition edge, the circulating counter includes a linear feedback shift register (LFSR), the memory includes a serial-in parallel-out (SIPO) memory, and the automatic gating circuit includes a Johnson counter and a set-reset (SR) NOR latch.

5. The TDC of claim 2, wherein:
the TRO includes a triggered digitally controlled ring oscillator (triggered DCRO) to generate multiple phases of the periodic TRO signal;
the sTDC includes a plurality of the sTDC components, wherein each sTDC component uses a phase of the periodic TRO signal; and
the bTDC digitally adds, using an OR circuit, the number of the TRO periods from the reference signal edge to each transition edge of each sTDC component.

6. The TDC of claim 5, further comprising:
a stochastic beating TDC (sbTDC) encoder for generating digital representations of the VCO period, and a polarity and the delay of a VCO signal relative to the periodic TRO signal, wherein the sbTDC encoder generates least significant bits (LSB) for the digital representations derived from the captured selected number of VCO states from the sTDC and generates most significant bits (MSB) for the digital representations derived from the captured count values from the memory of the bTDC, and the sbTDC encoder generates the polarity from the digital sequence of the multiple phases of the periodic TRO signal captured by the count values, wherein the polarity determines when the periodic TRO signal has a frequency higher or lower than the VCO signal.

7. The TDC of claim 6, further comprising:
a digital frequency-locked loop (DFLL) for controlling the frequency of the periodic TRO signal for the triggered DCRO using the period and the polarity generated by the sbTDC encoder.

8. The TDC of claim 6, wherein the TDC has a resolution of M-bits represented by $2^M$, where M=B+C, and B and C are positive integers, and the number of VCO states for the VCO period $N_s$ is represented by $2^B$ which is used to generate the MSB, and C-bits are derived from the sTDC used for the LSB, wherein the TRO period is represented by $N_s-1$ or $N_s+1$.

9. The TDC of claim 1, wherein one of the group of latches configured to store the VCO state uses the periodic TRO signal as an input to the latches, and clocks the latches using the VCO signal; and wherein the latches include delay flip-flops (D flip-flops), the selected number of VCO states is less than five VCO states, and the transition edge is a rising edge transition.

10. The TDC of claim 1, wherein the TDC has a resolution between 50 femtoseconds (fs) and 1 picoseconds (ps) with an integrated phase noise (iPN) less than −45 decibels relative to a carrier (dBc) and an operating power of less than 10 milliwatts (mW).

11. The TDC of claim 1, wherein the TDC is configured in a phase locked loop (PLL) to generate a clock frequency within a band of an Institute of Electrical and Electronics Engineers (IEEE) 802.11 ac or 802.11 ad standards, IEEE 802.16e or IEEE 802.16m-2011 standards, or third generation partnership project (3GPP) long term evolution (LTE) standard Release 8, 9, 10, or 11.

12. The TDC of claim 1, wherein the TDC is included in a wireless device that is selected from the group consisting of a user equipment (UE) and a mobile station (MS), and the wireless device is configured to connect to at least one of a wireless local area network (WLAN), a wireless personal area network (WPAN), and a wireless wide area network (WWAN), wherein the wireless device includes an antenna, a touch sensitive display screen, a speaker, a microphone, a graphics processor, an application processor, internal memory, a non-volatile memory port, or combinations thereof.

13. An all-digital phase locked loop (ADPLL) using the TDC of claim 1, comprising:
a digital phase/frequency detector configured to integrate frequency error by comparing a frequency word input to a differentiated TDC output in a feedback loop which is proportional to a frequency difference between the frequency word and the differentiated TDC output;
a digital loop filter configured to generate a filtered phase error signal by low-pass filtering the phase error signal;
a digitally controlled oscillator (DCO) configured to generate a periodic DCO signal at a specified frequency from the filtered phase error signal, wherein the filtered phase error signal is used to converge the DCO frequency to the specified frequency;
the TDC of claim 1, configured to generate a TDC output signal from the DCO signal and the reference signal; and
a differentiator configured to generate the differentiated TDC output by differentiating the TDC output signal.

14. A stochastic beating time-to-digital converter (sbTDC), having computer circuitry configured to:
generate a periodic ring oscillator signal having a triggered ring oscillator (TRO) period that is triggered from a reference signal edge, wherein the TRO period is a selected ratio of a digitally controlled oscillator (DCO) period and the TRO period is greater than or less than the DCO period by a specified fraction of the DCO period;
temporarily store a selected number of DCO states at an edge of a TRO signal clocked by a DCO signal in a stochastic TDC (sTDC) component, wherein each DCO state is stored in a group of latches, the edge is either a rising edge or a falling edge of a signal; and
capture the selected number of DCO states using the sTDC component when one latch in the group of latches transitions from a digital zero to a digital one, wherein the selected number of DCO states captures transitions for all of the latches in the group.

15. The computer circuitry of claim 14, wherein the computer circuitry is further configured to:
count the DCO states via clocking the DCO signal using a linear feedback shift register (LFSR) in a beating TDC (bTDC); and
capture count values of the LFSR in a serial-in parallel-out (SIPO) memory at a rising transition edge of an output of one latch in the group of latches and a subsequent rising transition edge of an output of one latch in the group of latches.

16. The computer circuitry of claim 15, wherein:
the computer circuitry configured to generate a periodic ring oscillator signal is further configured to:
generate multiple phases of the periodic ring oscillator signal; and
the computer circuitry configured to store and capture the selected number of DCO states is further configured to:

store and capture the selected number of DCO states for each phase of the periodic ring oscillator signal in an sTDC, wherein the sTDC includes a plurality of sTDC components, and each sTDC component uses a phase of the periodic ring oscillator signal as an input signal.

17. The computer circuitry of claim 16, wherein the computer circuitry is further configured to:
reset the TRO, the sTDC, and the bTDC after two rising transition edges from a sampling output of one of the sTDC components using an automatic gating circuit, wherein the automatic gating circuit includes a Johnson counter to count a rising transition edge from each of the sTDC components, and an output of the Johnson counter is coupled to a latch to perform the reset, wherein the Johnson counter counts a number that is one greater than the number of sTDC components; and
hold the captured count values and the captured selected number of DCO states until a subsequent trigger of a reference signal.

18. The computer circuitry of claim 16, wherein the computer circuitry is further configured to:
generate a digital representation of the DCO period including period least significant bits (LSB) and period most significant bits (MSB), wherein the period LSB are derived using the captured selected number of DCO states from the sTDC and the period MSB are derived using the captured count values from the SIPO memory of the bTDC;
generate a delay of the DCO signal relative to the periodic ring oscillator signal including delay LSB and delay MSB, wherein the delay LSB are derived using the captured selected number of DCO states from the sTDC and the delay MSB are derived using the captured count values from the SIPO memory of the bTDC; or
generate a polarity of the DCO signal relative to the periodic ring oscillator signal from the captured count values from the SIPO memory of the bTDC for at least two of the sTDC components, wherein the polarity determines when the periodic ring oscillator signal has a frequency lower than the DCO signal.

19. The computer circuitry of claim 18, wherein the computer circuitry is further configured to:
generate the periodic ring oscillator signal for the TRO using the DCO period and the polarity generated by the sbTDC encoder.

20. The computer circuitry of claim 14, wherein the computer circuitry is configured in a phase locked loop (PLL) to generate a clock frequency in a range of 4.8 to 60 Gigahertz (GHz) with an integrated phase noise (iPN) less than −45 decibels relative to a carrier (dBc) and an operating power of between 1 and 5 milliwatts (mW).

21. A method for time-to-digital conversion, comprising:
generating a periodic triggered ring oscillator (TRO) signal having a TRO period that is triggered from a reference signal edge, wherein the TRO period is a selected ratio of a voltage-controlled oscillator (VCO) period and the TRO period is greater than or less than the VCO period by a fraction of the VCO period;
generating least significant bits (LSB) for a stochastic beating time-to-digital conversion by:
capturing a selected number of VCO states of the periodic TRO signal clocked by a VCO signal, wherein each VCO state is stored in a group of latches, and
generating the digital representation of the LSB of the VCO period and a delay of the VCO signal relative to the periodic TRO signal via a stochastic beating time-to-digital converter (sbTDC) encoder using the captured selected number of VCO states; and
generating most significant bits (MSB) for a stochastic beating time-to-digital conversion by:
counting the VCO states clocked by the VCO signal using a circulating counter in a beating TDC (bTDC),
capturing count values of the circulating counter in a memory at an event edge of one latch in the group of latches and a subsequent event edge of one latch in the group of latches, and
generating the digital representation of the MSB of the VCO period and a delay of the VCO signal relative to the periodic TRO signal via the sbTDC encoder using the captured count values from the memory of the bTDC.

22. The method of claim 21, wherein:
generating a periodic TRO signal further comprises:
generating multiple phases of the periodic TRO signal; and
capturing a selected number of VCO states further comprises:
capturing the selected number of VCO states for each phase of the periodic TRO signal, wherein the selected number of VCO states captures transitions for the latches in the group for each phase.

23. The method of claim 22, further comprising:
generating a polarity of the VCO signal relative to the periodic TRO signal from the captured count values from the memory for at least two phases of the periodic TRO signal.

24. The method of claim 23, further comprising:
generating the periodic TRO signal for the TRO using the VCO period and the polarity.

25. The method of claim 23, further comprising:
transferring the captured count values for an event edge of each phase of the periodic TRO signal to the sbTDC encoder;
resetting a TRO generating the periodic TRO signal, the group of latches capturing the selected number of VCO states, and the memory for capturing the count values; and
holding the captured count values and the captured selected number of VCO states until a subsequent trigger of a reference signal.

26. At least one non-transitory machine readable storage medium comprising a plurality of instructions adapted to be executed to implement the method of claim 21.

* * * * *